US011929263B2

(12) United States Patent
Cheng et al.

(10) Patent No.: US 11,929,263 B2
(45) Date of Patent: Mar. 12, 2024

(54) METHOD AND SYSTEM FOR MANUFACTURING SEMICONDUCTOR

(71) Applicant: TAIWAN SEMICONDUCTOR MANUFACTURING COMPANY LTD., Hsinchu (TW)

(72) Inventors: Yu-Hsiang Cheng, New Taipei (TW); Shih Huan Chiu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 532 days.

(21) Appl. No.: 17/085,384

(22) Filed: Oct. 30, 2020

(65) Prior Publication Data

US 2022/0139728 A1    May 5, 2022

(51) Int. Cl.
*H01L 21/67*   (2006.01)
*C23C 16/455*  (2006.01)

(52) U.S. Cl.
CPC .. *H01L 21/67017* (2013.01); *C23C 16/45589* (2013.01); *H01L 21/67253* (2013.01)

(58) Field of Classification Search
CPC .............. H01L 21/67017; H01L 21/67155
See application file for complete search history.

(56) References Cited

U.S. PATENT DOCUMENTS

2020/0043709 A1*  2/2020  Agarwal ........... C23C 16/45536

\* cited by examiner

*Primary Examiner* — Jae Lee
(74) *Attorney, Agent, or Firm* — WPAT LAW; Anthony King (57) ABSTRACT

The present disclosure provides a semiconductor manufacturing method and a system therefore. The semiconductor manufacturing method includes: providing a gas from a container through an outlet to a semiconductor wafer manufacturing equipment, wherein a control valve is connected to the outlet to control a gas flow; retrieving a set of parameters corresponding to the gas flow; and determining a nominal position of the control valve by incorporating the set of parameters through a processor in order to provide a desired flow passage into the semiconductor wafer manufacturing equipment, wherein the semiconductor wafer manufacturing equipment includes a plurality of independent reaction chambers, wherein each reaction chamber is individually supplied with a gas pipe, and each gas pipe receives the gas from the container.

20 Claims, 9 Drawing Sheets

Providing the gas from the gas source to at least one chamber of the semiconductor wafer manufacturing equipment
S501

Detecting at least one environmental parameter corresponding to the gas source
S502

Controlling the gas source to provide the gas within the pressure range
S503

FIG. 5A

Determining the number of at least one chamber
S504

FIG. 5B

METHOD AND SYSTEM FOR MANUFACTURING SEMICONDUCTOR

BACKGROUND

During some semiconductor manufacturing procedures, the semiconductor wafers need to be processed in the reaction chamber filled with specific gas. For maintaining the stability of processing the semiconductor wafers in the reaction chamber, the gas pressure in the reaction chamber needs to be stable. However, various factors may cause unanticipated variation of the gas pressure in the reaction chamber.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
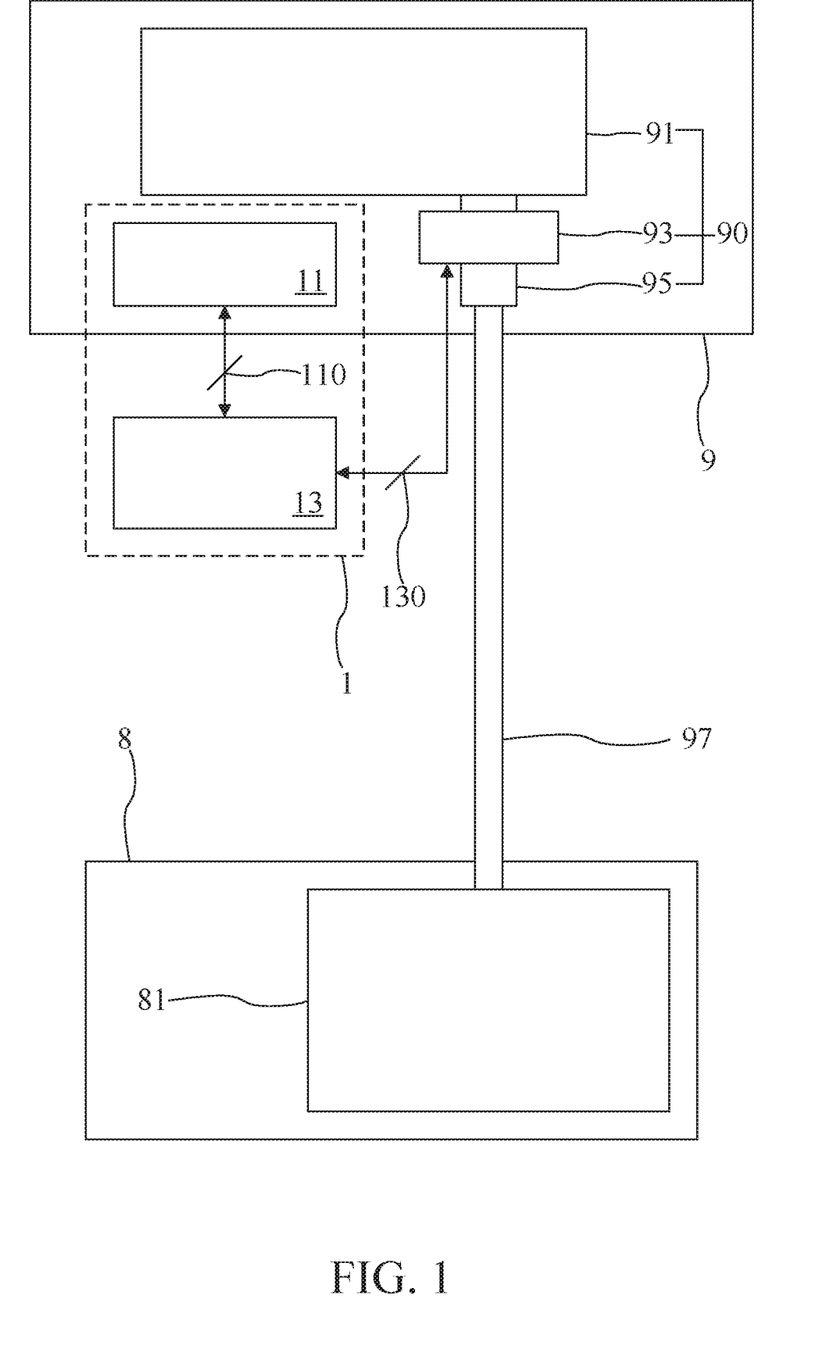
FIG. 1 is a schematic view of manufacturing semiconductor with a system according to some embodiments of the present disclosure.

Referring to FIG. 1 for some embodiments of the present disclosure, FIG. 1 is a schematic view of manufacturing semiconductor with a system 1 according to some embodiments of the present disclosure.

In some embodiments, a semiconductor wafer manufacturing equipment 8 may be provided. The semiconductor wafer manufacturing 8 may have a chamber 81 for receiving semiconductor wafers. The semiconductor wafers may be processed in the chamber 81 of the semiconductor wafer manufacturing equipment 8. While processing the semiconductor wafers in the chamber 81 of the semiconductor wafer manufacturing equipment 8, different gases may be introduced to the chamber 81 for different purposes.

In some embodiments, a gas source 90 may provide gas to the chamber 81 of the semiconductor wafer manufacturing equipment 8. The gas source 90 may include a gas container 91, a valve 93 and an outlet 95. The gas container 91 may be disposed in a space 9 (e.g., a cabinet). The outlet 95 of the gas source 90 may connect to the chamber 81 of the semiconductor wafer manufacturing equipment 8 via a pipe 97. The gas container 91 may provide gas to the chamber 81 of the semiconductor wafer manufacturing equipment 8 via the outlet 95 through the pipe 97. The valve 93 may be equipped to the gas container 91 and the outlet 95. The valve 93 may be used for controlling a gas flow of the gas. In one embodiment, the valve 93 is a regulator.

In some embodiments, the valve 93 may be adjusted to different positions (e.g., different graduations). Different position of the valve 93 (e.g., different graduation of the valve 93) may correspond to a different output level of the valve 93 while the gas is provided. For example, "N" positions (e.g., "N" graduations) are defined for the valve 93, and "N" positions of the valve 93 respectively correspond to "N" output levels of providing the gas. To provide a desired gas flow from the gas container 91 into the chamber 81 of the semiconductor wafer manufacturing equipment 8, the valve 93 may be adjusted to a desired position corresponding to a desired output level.

In some semiconductor wafer processes operated by the semiconductor wafer manufacturing equipment 8, gas pressure in the chamber 81 of the semiconductor wafer manufacturing equipment 8 may need to be precisely controlled for maintaining the stability of processing the semiconductor wafers in the chamber 81. Any unexpected variation of the gas pressure in the chamber 81 may cause the process of the semiconductor wafer fail.

However, variations of the environment surrounding the space 9 may influence the pressure balances of providing the gas from the gas source 90, and consequently, the gas pressure or inflow to the chamber 81 of the semiconductor wafer manufacturing equipment 8 is affected in undesirable ways. Therefore, to keep the gas pressure or inflow in a stable manner during wafer process, the environment conditions of the space 9 need to be monitored and the gas flow provided by the gas source 90 need to be dynamically controlled according to the variations of the environment conditions of the space 9.

In some embodiments, the system 1 may be introduced for controlling the gas flow of the gas source 90 according to the environment conditions of the space 9. The system 1 may include a sensor 11 and a processor 13. The sensor 11 and the processor 13 may he electrically connected. The sensor 11 may be disposed in the space 9. The sensor 11 may be adjacent to the gas container 91 of the gas source 90.

The sensor 11 may be used to monitor the environment conditions of the space 9. The sensor 11 may sense at least one environmental parameter 110 under the environment conditions of the space 9. The sensor 11 may transmit the at least one environmental parameter 110 to the processor 13. The processor 13 may receive the at least one environmental parameter 110 from the sensor 11. According to the at least one environmental parameter 110, the processor 13 may control the valve 93 of the gas source 90 to provide a gas within a pressure range.

In some embodiments, under a specific environment condition of the space 9, the valve 93 of the gas source 90 may need to be adjusted to a nominal position (i.e., a specific graduation) to provide a desired flow passage from the gas container 91 into the chamber 81. The desired flow passage may keep the gas pressure in the chamber 81 stable.

Accordingly, when the sensor 11 senses the at least one environment parameter 110 under the specific environment condition of the space 9, the processor 13 may determine the nominal position of the valve 93 by incorporating the at least one environmental parameter 110 The processor 13 may transmit a signal 130 to control the valve 93 to reach the nominal position. When the valve 93 reaches the nominal position, the desired flow passage from the gas container 91 into the chamber 81 may keep the gas pressure in the chamber 81 stable.

In other words, under the specific environment condition of the space 9, the valve 93 of the gas source 90 may need to be controlled to provide the gas with a specific output level. When the valve 93 provides the gas with the specific output level, the gas pressure in the chamber 81 may be stable. The specific output level of the valve 93 may correspond to the nominal position of the valve 93.

Accordingly, when the sensor 11 senses the at least one environment parameter 110 under the specific environment condition of the space 9, the processor 13 may determine the specific output level of the valve 93 according to the at least one environmental parameter 110. To reach the specific output level of the valve 93, the processor 13 may transmit the signal 130 to control the valve 93 to reach the nominal position. The gas provided by the valve 93 with the specific level may stabilize the gas pressure in the chamber 81.

In some embodiments, correspondences among the environmental parameters, the positions of the valve 93 and the output levels of the valve 93 may be recorded on a table (not shown). The table may be stored in a memory (not shown). The memory may be electrically connected to the processor 13. The processor 13 may access the memory to retrieve the table.

In some embodiments, variations of the environment surrounding the space 9 may influence the pressure balances of providing the gas from the gas source 90, and then may cause decrease of the gas pressure in the chamber 81 of the semiconductor wafer manufacturing equipment 8. To prevent the decrease of the gas pressure in the chamber 81, the processor 13 may control the valve 93 for compensating the decrease of the gas pressure according to the change of the environment condition of the space 9.

The sensor 11 may sense the at least one environmental parameter 110 after the variations of the environment surrounding the space 9. The sensor 11 may transmit the at least one environmental parameter 110 to the processor 13. After retrieving the environmental parameter 110 from the sensor 11, the processor 13 may determine a specific nominal position of the valve 93 according to the environmental parameter 110 for increasing output level of the valve 93. The processor 13 may transmit the signal 130 to control the valve 93 to reach the specific nominal position. When the valve 93 reaches the specific nominal position, the gas may be provided from the gas container 91 with a specific output level (e.g., an output level for outputting more gases) so that the decreased gas pressure in the chamber 81 may be compensated.

In some embodiments, variations of the environment surrounding the space 9 may influence the pressure balances of providing the gas from the gas source 90, and then may cause increase of the gas pressure in the chamber 81 of the semiconductor wafer manufacturing equipment 8. To prevent the increase of the gas pressure in the chamber 81, the processor 13 may control the valve 93 for eliminating the increase of the gas pressure according to the change of the environment condition of the space 9.

The sensor 11 may sense the at least one environmental parameter 110 after the variation of the environment surrounding the space 9. The sensor 11 may transmit the at least one environmental parameter 110 to the processor 13. After retrieving the environmental parameter 110 from the sensor 11, the processor 13 may determine a specific nominal position of the valve 93 according to the environmental parameter 110 for decreasing output level of the valve 93. The processor 13 may transmit the signal 130 to control the valve 93 to reach the specific nominal position. When the valve 93 reaches the specific nominal position, the gas may be provided from the gas container 91 with a specific output level (e.g., an output level for outputting less gases) so that the increased gas pressure in the chamber 81 may be eliminated.

Figure 2A:
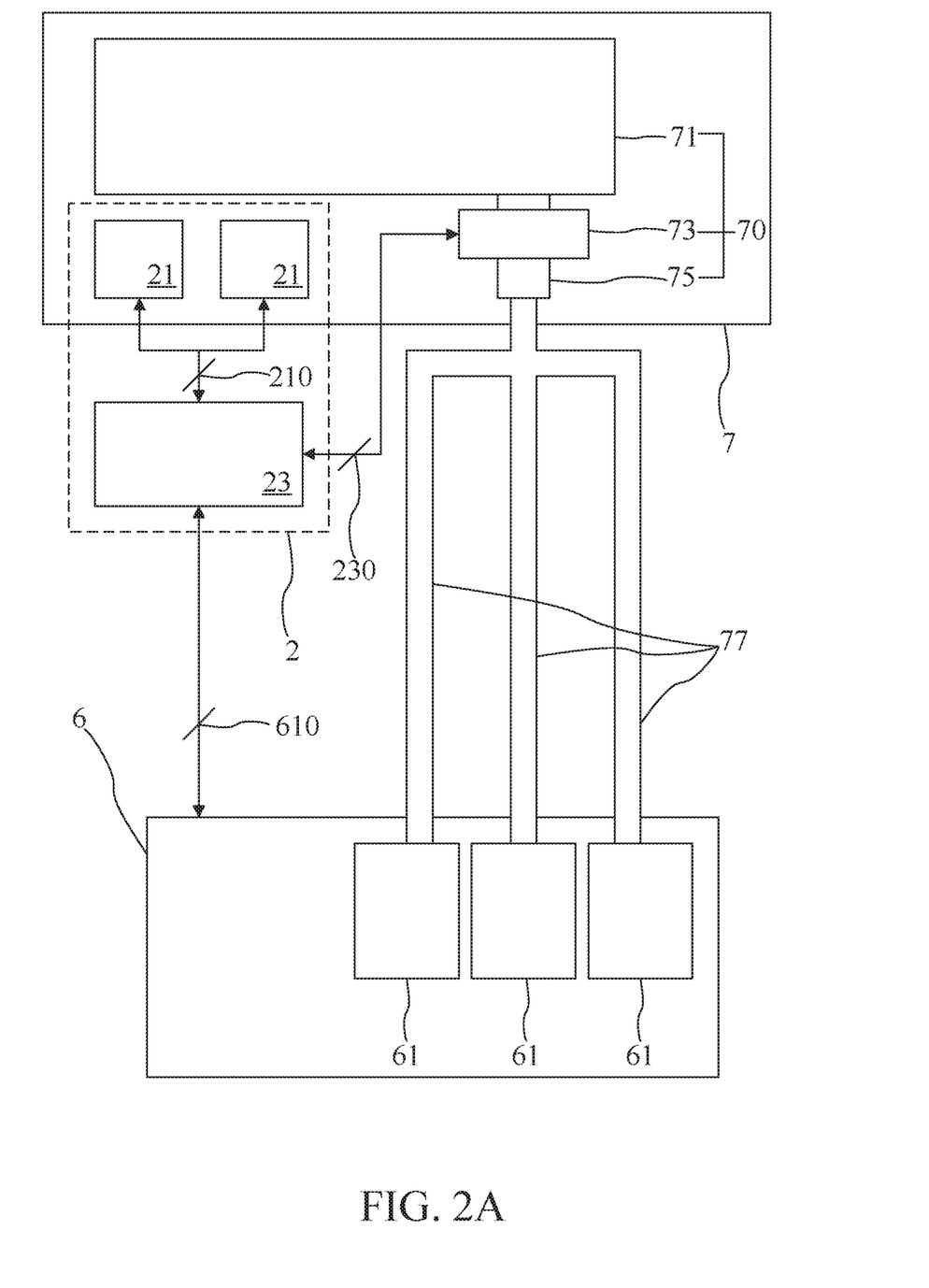
FIG. 2A is a schematic view of manufacturing semiconductor with a system according to some embodiments of the present disclosure.

Referring to FIG. 2A for some embodiments of the present disclosure, FIG. 2A is a schematic view of manufacturing semiconductor with a system 2 according to some embodiments of the present disclosure.

In some embodiments, a semiconductor wafer manufacturing equipment 6 may be provided. The semiconductor wafer manufacturing 6 may have a plurality chambers 61 for receiving semiconductor wafers. The semiconductor wafers may be processed in the chambers 61 of the semiconductor wafer manufacturing equipment 6. While processing the semiconductor wafers in the chamber 61 of the semiconductor wafer manufacturing equipment 6, different gases may be introduced to the chambers 61 for different purposes.

In some embodiments, a gas source 70 may provide gas to the chambers 61 of the semiconductor wafer manufacturing equipment 6. The gas source 70 may include a gas container 71, a valve 73 and an outlet 75. The gas container 71 may be disposed in a space 7 (e.g., a cabinet). The outlet 75 of the gas source 70 may connect to the chambers 61 of the semiconductor wafer manufacturing equipment 6 via a plurality of pipes 77. Each chamber 61 may be individually supplied with one pipe 77. The gas container 71 may provide gas to the chambers 61 of the semiconductor wafer manufacturing equipment 6 via the outlet 75 through the pipes 77. The valve 73 may be equipped to the gas container 71 and the outlet 75. The valve 73 may be used for controlling a gas flow of the gas. In one embodiment, for being controlled remotely, the valve 73 is a regulator which includes an electric valve.

In some embodiments, the valve 73 may be adjusted to different positions different graduations). Different position of the valve 73 (e.g., different graduation of the valve 73) may correspond to a different output level of the valve 73 of while the gas is provided. For example, "N" positions (e.g., "N" graduations) are defined for the valve 73, and "N" positions of the valve 73 may respectively correspond to "N" output levels of providing the gas. To provide a desired gas flow from the gas container 71 into the chamber 61 of the semiconductor wafer manufacturing equipment 6, the valve 73 may be adjusted to a desired position corresponding to a desired output level.

In some semiconductor wafer processes operated by the semiconductor wafer manufacturing equipment 6, gas pressures in the chambers 61 of the semiconductor wafer manufacturing equipment 6 may need to be precisely controlled for maintaining the stability of processing the semiconductor wafers in the chambers 61. Any unexpected variation of the gas pressure in the chamber 61 may cause the process of the semiconductor wafer fail.

However, variations of the environment (e.g., temperature and humidity) surrounding the space 7 may influence the pressure balances of providing the gas from the gas source 70, and consequently, the gas pressures or inflows to the chambers 61 of the semiconductor wafer manufacturing equipment 6 are affected in undesirable ways. Therefore, to keep the gas pressures or inflows in a stable manner during wafer process, the environment conditions of the space 7 need to be monitored and the gas flow provided by the gas source 70 may need to be dynamically controlled according to the variations of the environment conditions of the space 7.

In addition to the variations of environment conditions of the space 7, the different numbers of the chambers 61 activated for processing the semiconductor wafers may influence the pressure balances of providing the gas from the gas source 70, and consequently, the gas pressures or inflows to the chambers 61 of the semiconductor wafer manufacturing equipment 6 are affected in undesirable ways. Therefore, to keep the gas pressures or inflows in a stable manner during wafer process, the number of the chambers 61 activated for processing the semiconductor wafers may need to be monitored as well and the gas flow provided by the gas source 70 may need to be dynamically controlled according to the number of the chambers 61 activated for processing the semiconductor wafers.

In some embodiments, the system 2. may be introduced for controlling the gas flow of the gas source 70 according to the environment conditions of the space 7. The system 2 may include sensors 21 and a processor 23. The sensors 21 and the processor 23 may be electrically connected. The sensors 21 may be disposed in the space 7. The sensors 21 may be adjacent to the gas container 71 of the gas source 70.

The sensors 21 may be used to monitor the environment conditions of the space 7. The sensors 21 may sense a plurality of environmental parameters 210 under the environment conditions of the space 7. The sensors 21 may transmit the environmental parameters 210 to the processor 23. The processor 23 may receive the environmental parameters 210 from the sensors 21. In some embodiments, the sensors 21 may include a temperature sensor and a humidity sensor. The environmental parameters 210 may include a temperature parameter and a humidity parameter.

The processor 23 may receive a number 610 of the chambers 61 activated for processing the semiconductor wafers from the semiconductor wafer manufacturing equipment 6. According to the temperature parameter, the humidity parameter, and the number 610 of the chambers 61 activated for processing the semiconductor wafers, the processor 23 may control the valve 73 of the gas source 70 to provide a gas within a. pressure range.

In some embodiments, when the gas container 71 is under a specific environment condition of the space 7 and a specific number of chambers 61 are activated for processing the semiconductor wafers, the valve 73 of the gas source 70 may need to be adjusted to a nominal position (i.e., a specific graduation) to provide desired flow passages from the gas container 71 into the chambers 61. The desired flow passages may keep the gas pressure in each chamber 61 stable.

Accordingly, when the sensors 21 senses the temperature parameter and the humidity parameter under the specific environment condition of the space 7 and the semiconductor wafer manufacturing equipment 6 transmits the specific number of the chambers 61 activated for processing the semiconductor wafers, the processor 23 may determine the nominal position of the valve 73 by incorporating the temperature parameter, the humidity parameter and the specific number of the chambers 61 activated for processing the semiconductor wafers. The processor 13 may transmit a signal 230 to control the valve 73 to reach the nominal position. When the valve 73 reaches the nominal position, the desired flow passages from the gas container 71 into the chambers 61 may keep the gas pressure in each chamber 61 stable.

In other words, when the gas container 71 is under the specific environment condition of the space 7 and the specific number of chambers 61 are activated for processing the semiconductor wafers, the valve 73 of the gas source 70 may need to be controlled to provide the gas with a specific output level. When the valve 73 provides the gas with the specific output level, the gas pressure in the chamber 71 may be stable. The specific output level of the valve 73 may correspond to the nominal position of the valve 73.

Accordingly, when the sensors 21 senses the temperature parameter and the humidity parameter under the specific environment condition of the space 7 and the semiconductor wafer manufacturing equipment 6 transmits the specific number of the chambers 61 activated for processing the semiconductor wafers, the processor 23 may determine the specific output level of the valve 73 according to the temperature parameter, the humidity parameter and the specific number of the chambers 61 activated for processing the semiconductor wafers. To reach the specific output level of the valve 73, the processor 23 may transmit the signal 230 to control the valve 73 to reach the nominal position. The gas provided by the valve 73 with the specific level may stabilize the gas pressure in each chamber 61.

In some embodiments, correspondences among the temperature parameters, the humidity parameters, the numbers of chambers activated for processing the semiconductor wafers, the positions of the valve 73 and the output levels of the valve 73 may be recorded on a table (not shown). The table may be stored in a memory (not shown). The memory may be electrically connected to the processor 23. The processor 23 may access the memory to retrieve the table.

In some embodiments, variations of the environment surrounding the space 7 and more chambers 61 activated for processing the semiconductor wafers may influence the pressure balances of providing the gas from the gas source 70, and then may cause decrease of the gas pressures in the chambers 61 of the semiconductor wafer manufacturing equipment 6. For example, when the gas source 70 provides the gas to one activated chamber 61 with a specific gas pressure, the gas pressure in this chamber 61 is 'X'. Then, when one more chamber 61 is activated and the gas source 70 provides the gas to these two activated chambers 61 with the same specific gas pressure, the gas pressure in each chamber 61 is lower than 'X' because the gas flow provided by the gas source 70 is shared.

To prevent the decreases of the gas pressures in the chambers 61, the processor 23 may control the valve 73 for compensating the decrease of the gas pressures according to the variation of the environment surrounding the space 7 and the number of the chambers 61 activated for processing the semiconductor wafers.

The sensors 21 may sense a temperature parameter and a humidity parameter after the change of the environment condition of the space 7. The sensors 21 may transmit the temperature parameter and the humidity parameter to the processor 23. The semiconductor wafer manufacturing equipment 6 may transmit a number of the chambers 61 activated for processing the semiconductor wafers to the processor 23.

After retrieving the temperature parameter, the humidity parameter and the number of the chambers 61 activated for processing the semiconductor wafers, the processor 23 may determine a specific nominal position of the valve 73 according to the temperature parameter, the humidity parameter and the number of the chambers 61 activated for processing the semiconductor wafers for increasing output level of the valve 73. The processor 23 may transmit the signal 230 to control the valve 73 to reach the specific nominal position. When the valve 73 reaches the specific nominal position, the gas may be provided from the gas container 71 with a specific output level (e.g., an output level for outputting more gases) so that the decreased gas pressure in the chambers 61 may be compensated.

In some embodiments, variation of the environment surrounding the space 7 and fewer chambers 61 activated for processing the semiconductor wafers may influence the pressure balances of providing the gas from the gas source 70, and then may cause increases of the gas pressures in the chambers 61 of the semiconductor wafer manufacturing equipment 6. For example, when the gas source 70 provides the gas to two activated chambers 61 with a specific gas pressure, the gas pressure in each chamber 61 is 'Y'. Then, when one of these two chambers 61 is deactivated and the gas source 70 provides the gas to the remained activated chamber 61 with the same specific gas pressure, the gas pressure in the remained activated chamber 61 is higher than 'Y' because the gas flow provided by the gas source 70 is gathered up into the remaining activated chamber 61.

To prevent the increases of the gas pressures in the chambers 61, the processor 23 may control the valve 73 for eliminating the increase of the gas pressures according to the variations of the environment surrounding the space 7 and the number of the chambers 61 activated for processing the semiconductor wafers.

The sensors 21 may sense a temperature parameter and a humidity parameter after the change of the environment condition of the space 7. The sensors 21 may transmit the temperature parameter and the humidity parameter to the processor 23. The semiconductor wafer manufacturing equipment 6 may transmit a number of the chambers 61 activated for processing the semiconductor wafers to the processor 23.

After retrieving the temperature parameter, the humidity parameter and the number of the chambers 61 activated for processing the semiconductor wafers, the processor 23 may determine a specific nominal position of the valve 73 according to the temperature parameter, the humidity parameter and the number of the chambers 61 activated for processing the semiconductor wafers for decreasing output level of the valve 73. The processor 23 may transmit the signal 230 to control the valve 73 to reach the specific nominal position. When the valve 73 reaches the specific nominal position, the gas may be provided from the gas container 71 with a specific output level (e.g., an output level for outputting less gas' so that the increased gas pressure in the chambers 61 may be eliminated.

In some embodiments, because variations of pressure in the space 7 may influence the pressure balances of providing the gas from the gas source 90, pressure in the space 7 may need to be monitor. The sensors 21 may further include a pressure sensor (not shown). The environmental parameters 210 corresponding to the environment conditions of the space 7 may include a pressure parameter. The processor 23 may determine the nominal position of the valve 73 according to the temperature parameter, the humidity parameter, the pressure parameter, and the number of the chambers 61 activated for processing the semiconductor wafers.

In some embodiments, the semiconductor manufacturing equipment 6 may perform deposition of tungsten film (W film) on the semiconductor wafers in multiple chambers 61. The semiconductor manufacturing equipment 6 may have a flow setting of a recipe of performing deposition of W film. Because changing of the flow setting of the recipe of performing deposition of W film may influence the pressure balances of providing the gas from the gas source 90, the flow setting of the recipe of performing deposition of W film may need to be monitor.

The semiconductor manufacturing equipment 6 may further transmit the flow setting of the recipe of performing deposition of W film to the system 2. The processor 23 may determine the nominal position of the valve 73 according to the temperature parameter, the humidity parameter, the pressure parameter, the flow setting of the recipe of performing deposition of W film and the number of the chambers 61 activated for processing the semiconductor wafers.

Figure 2B:
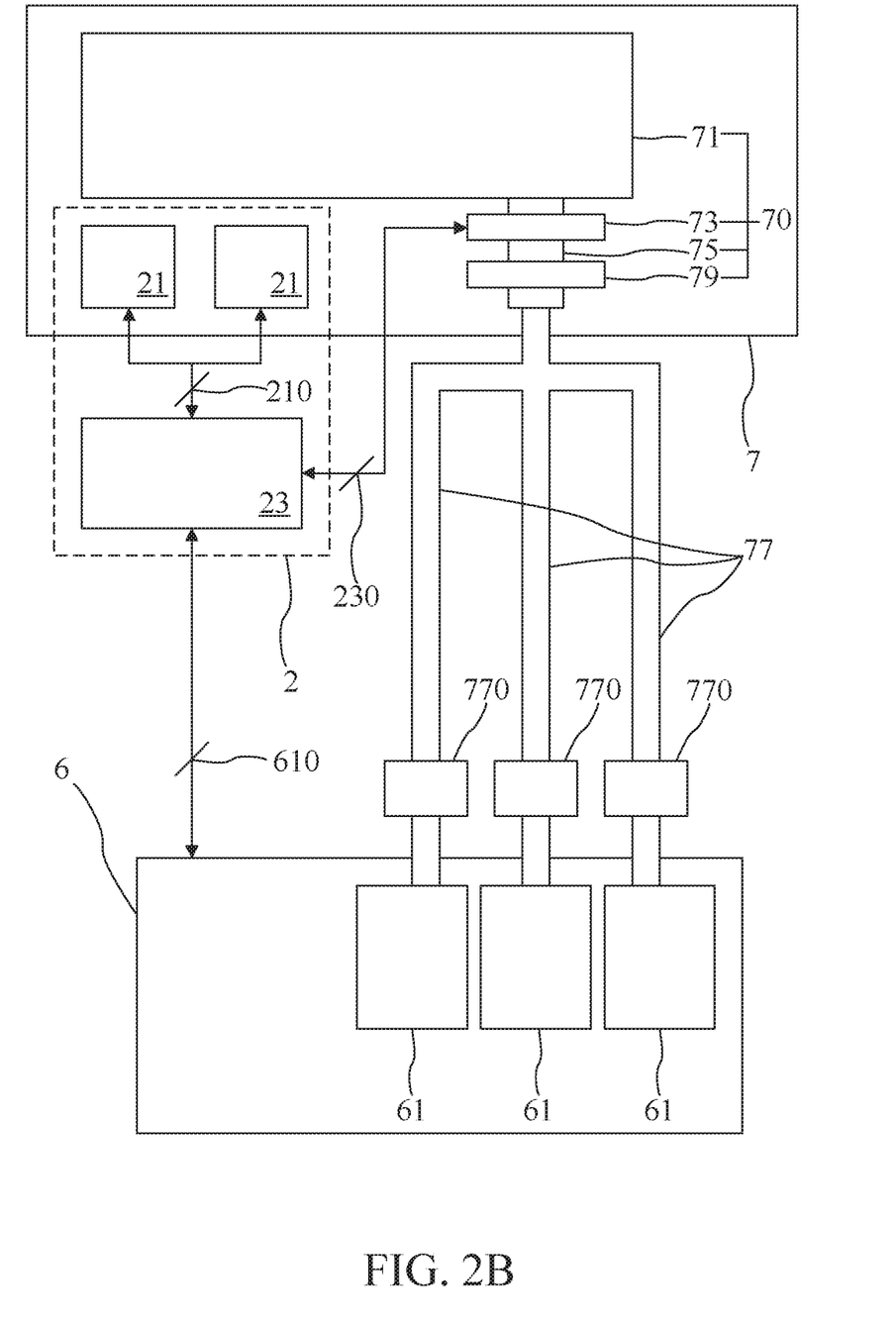
FIG. 2B is a schematic view of manufacturing semiconductor with a system according to some embodiments of the present disclosure.

Referring to FIG. 2B for some embodiments of the present disclosure, FIG. 2B is another schematic view of manufacturing semiconductor with the system 2 according to some embodiments of the present disclosure.

In some embodiments, the gas source 70 may further include a pressure gauge 79. The pressure gauge 79 may be disposed adjacent to the outlet 75 for measuring a gas pressure around the outlet 75. The measured gas pressure may be transmitted to the processor 23. The processor 23 may verify the measured gas pressure with a specified outlet pressure to check if the measured gas pressure meets the specified outlet pressure.

In some embodiments, the chambers 61 may share the same gas source 70. Respectively, one pipe 77 may be independently connected to each individual chamber 61 on one end, and then merged and connected to the pressure gauge 79 on the other end. Each pipe 77 may be equipped with a mass flow controller 770. The gas flow through each pipe 77 may be adjusted by the corresponding mass flow controller 770.

In some embodiments, the above sensor and the above processor may be electrically connected through a communication bus. The communication bus may include a communication interface for transferring data between the elements, such as the sensor and the processor, and may include an electrical bus interface, an optical bus interface or even a wireless bus interface. However, such description is not intended to limit the hardware implementation embodiments of the present disclosure.

In some embodiments, the semiconductor wafer manufacturing equipment may perform deposition of a W film on the semiconductor wafers in the chamber. To deposit the W film on the semiconductor wafers in the chamber, the gas provided into the chamber of the semiconductor wafer manufacturing equipment may include tungsten hexafluoride ($WF_6$).

While depositing the W film on the semiconductor wafers in the chamber, the gas including $WF_6$ may be provided within a negative pressure range. For compensating the decrease of the gas pressures or eliminating the increase of the gas pressures in the chamber, the system (e.g., the system 1 or system 2) may control the gas source to provide the gas within −0.5 Pa to −2.5 Pa.

Figure 3A:
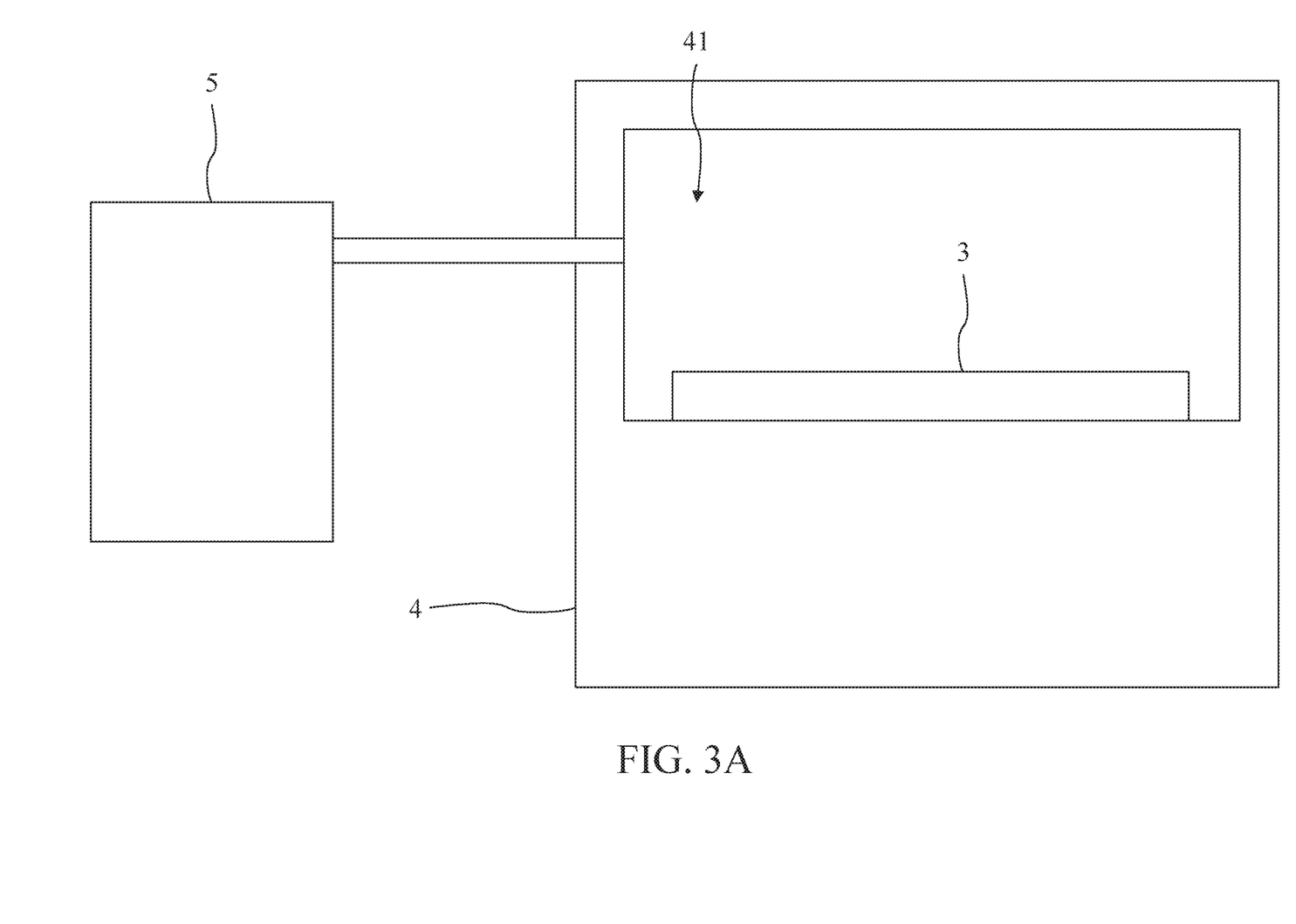
FIG. 3A is a schematic view of processing a semiconductor wafer in a chamber of a semiconductor manufacturing equipment according to some embodiments of the present disclosure.

Referring to FIG. 3A for some embodiments of the present disclosure, FIG. 3A is a schematic view of processing a semiconductor wafer 3 in a chamber 41 of a semiconductor manufacturing equipment 4 according to some embodiments of the present disclosure.

In some embodiments, the semiconductor wafer 3 may be received in the chamber 41 of the semiconductor manufacturing equipment 4. The chamber 41 of the semiconductor manufacturing 4 may be filled with $WF_6$ from a gas source 5 for depositing W film on the semiconductor wafer 3.

Figure 3B:
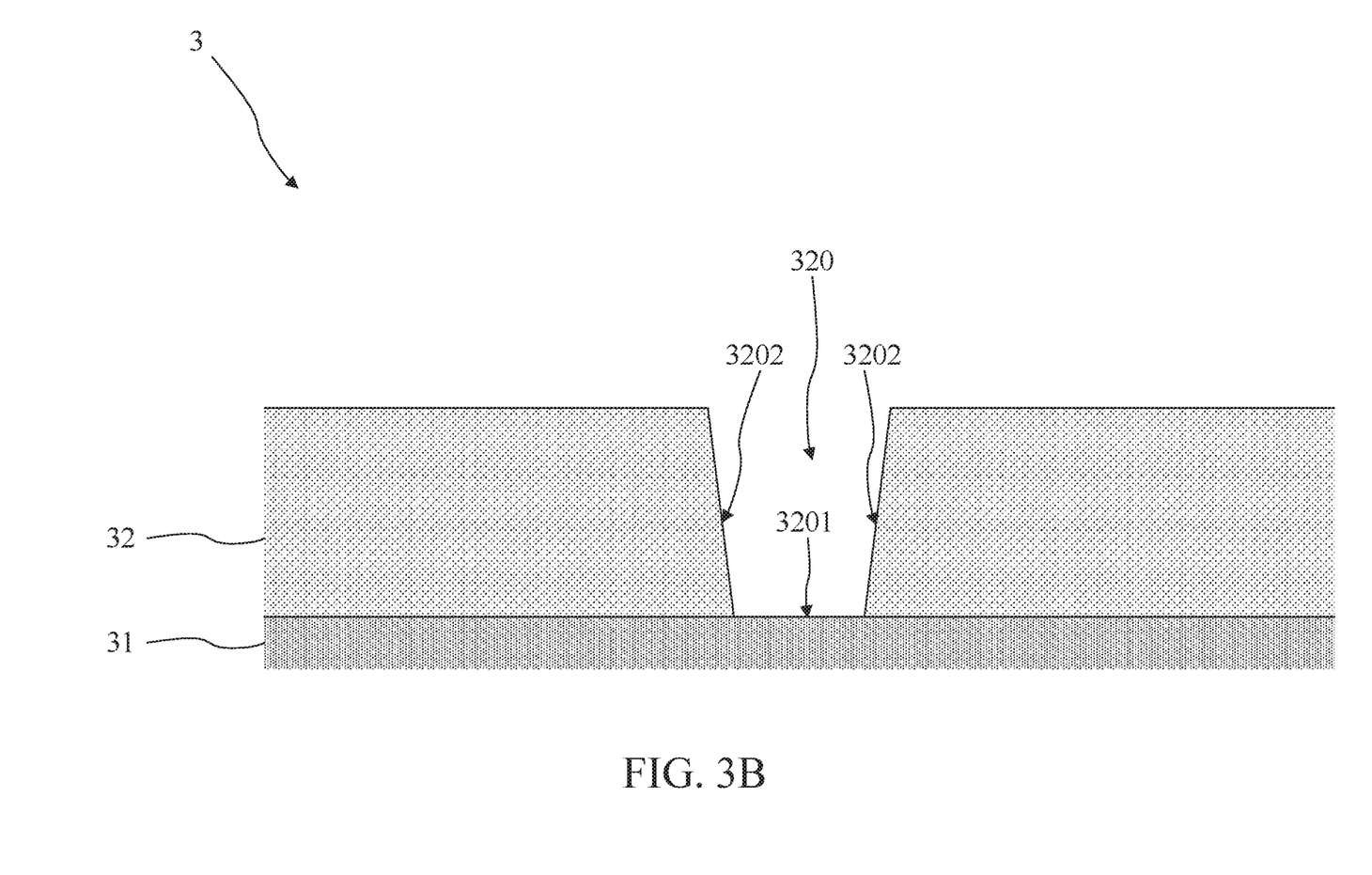
FIGS. 3B and 3C are schematic views of depositing a W film on a semiconductor wafer according to some embodiments of the present disclosure.
Figure 3C:
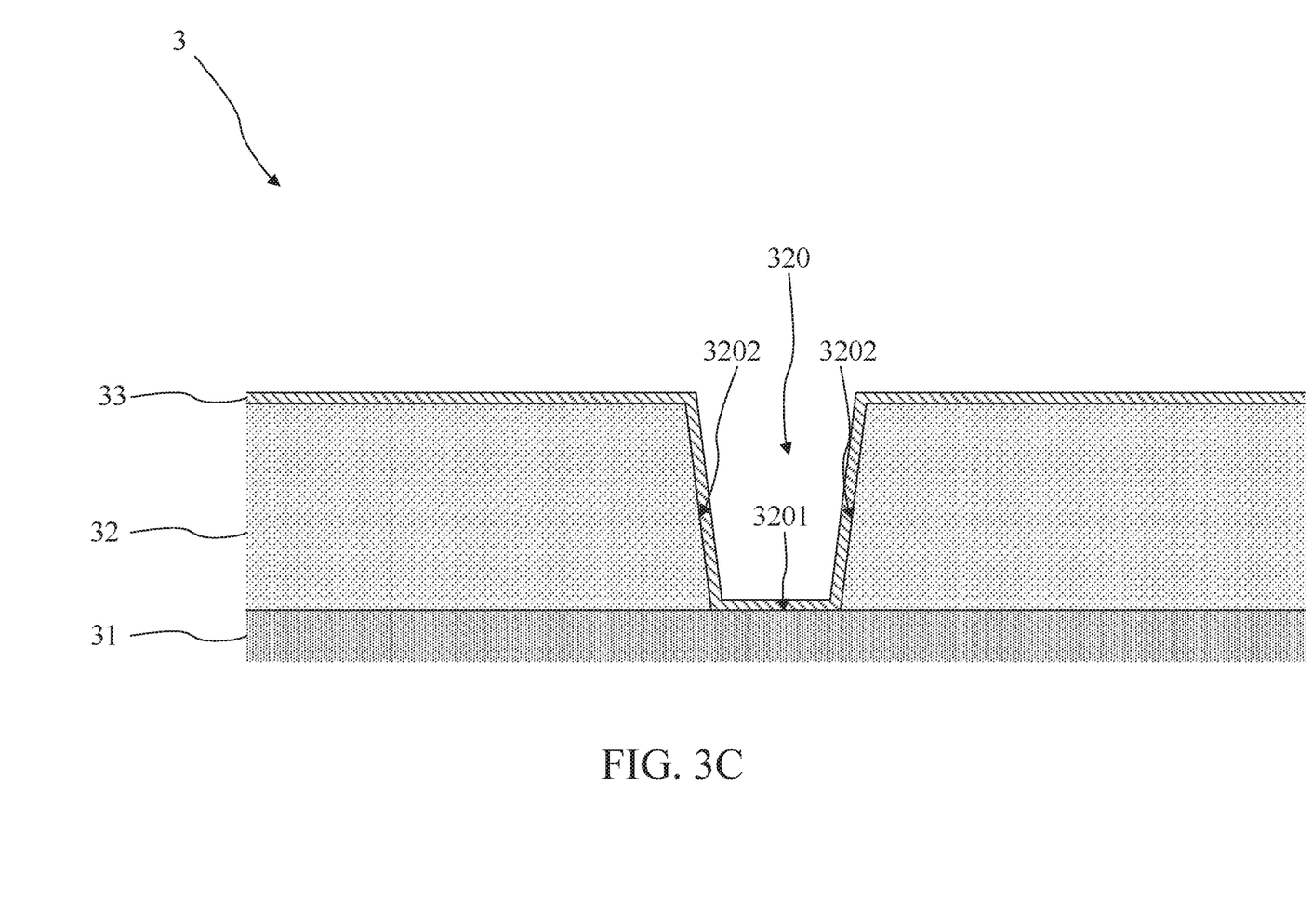

Referring to FIGS. 3B and 3C for some embodiments of the present disclosure, FIGS. 3B and 3C are schematic views of depositing the W film on the semiconductor wafer 3 according to some embodiments of the present disclosure.

In some embodiments, the semiconductor wafer 3 may include a first layer 31 and a second layer 32 formed on the first layer 31. A trench 320 may be formed in the second layer 32. Portion of the first layer 31 may be exposed from bottom of the trench 320. The exposed portion of the first layer 31 may form a bottom wall 3201 of the trench 320, The trench 320 may have sidewalk 3202. A material of the first layer 31 may include semiconductive material (e.g., silicon) or conductive material (e.g., metal). A material of the second layer 32 may include dielectric material.

When the semiconductor wafer 3 is processed in the chamber 41 filled with $WF_6$, a W film 33 may be deposited on the bottom wall 3201 and the sidewalls 3202 of the trench 320 in the semiconductor wafer 3. During the deposition of the W film 33, the W film 33 may be well deposited on the semiconductor wafer 3 when the gas pressure in the chamber 41 is stable.

Figure 4A:
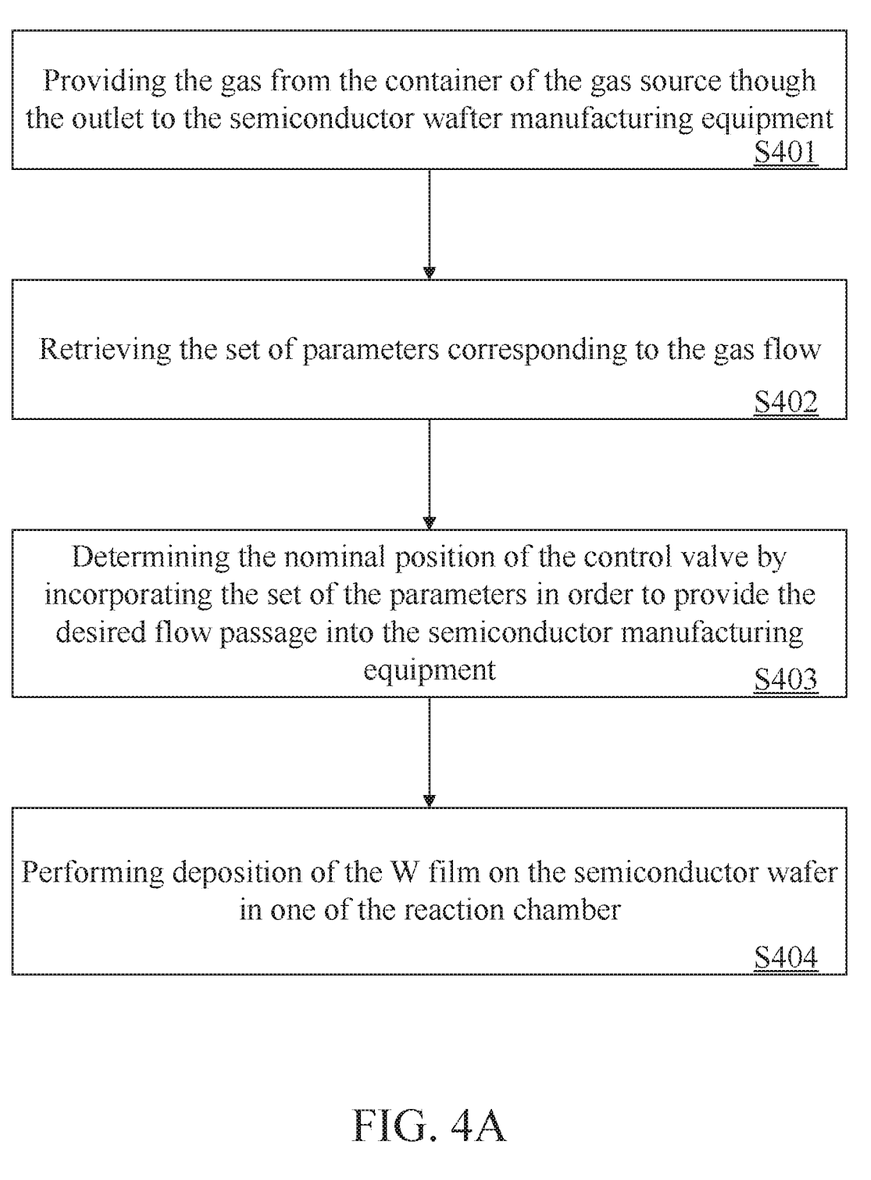
FIGS. 4A and 4B are flowchart diagrams according to some embodiments of the present disclosure.

Some embodiments of the present disclosure include a semiconductor manufacturing method, and a flowchart diagram thereof is as shown in FIG. 4A. The method of some embodiments is implemented by a semiconductor manufacturing equipment, a gas source and a system (e.g., the system 1 or 2 of the aforesaid embodiments). Detailed operations of the method are as follows.

Operation S401 is performed to provide a gas from a container of the gas source through an outlet to the semiconductor wafer manufacturing equipment. A control valve is connected to the outlet to control a gas flow. Operation S402 is performed to retrieve a set of parameters corresponding to the gas flow. Operation S403 is performed to determine a nominal position of the control valve by incorporating the set of parameters through a processor in order to provide a desired flow passage into the semiconductor wafer manufacturing equipment. The semiconductor wafer manufacturing equipment includes a plurality of independent reaction chambers. Each reaction chamber is individually supplied with a gas pipe, and each gas pipe receives the gas from the container.

In some embodiments, the gas includes $WF_6$ and operation S404 is performed to perform deposition of a W film on a semiconductor wafer in one of the reaction chambers. The W film is deposited on a wall of a trench in the semiconductor wafer. A semiconductive or conductive material is exposed from the bottom of the trench. The trench has a dielectric sidewall.

In some embodiments, the set of parameters used for determining the nominal position of the control valve includes: environment temperature inside a cabinet accommodating the container, pressure inside the cabinet, number of the reaction chambers being actively performing deposition of the W film, and flow setting of a recipe for performing deposition of the W film.

Figure 4B:
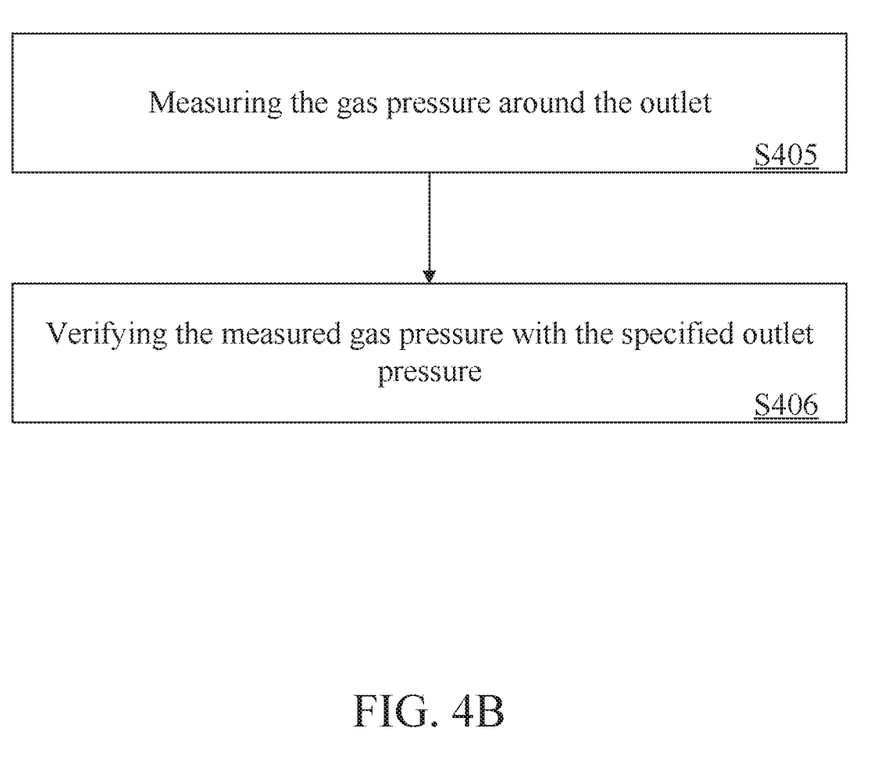

In some embodiments, operations S405 and S406 in FIG. 4B are optionally performed to: measure a gas pressure around the outlet by a pressure gauge; verify the measured gas pressure with a specified outlet pressure by the processor to check if the measured gas pressure meets the specified outlet pressure.

Figure 5A:
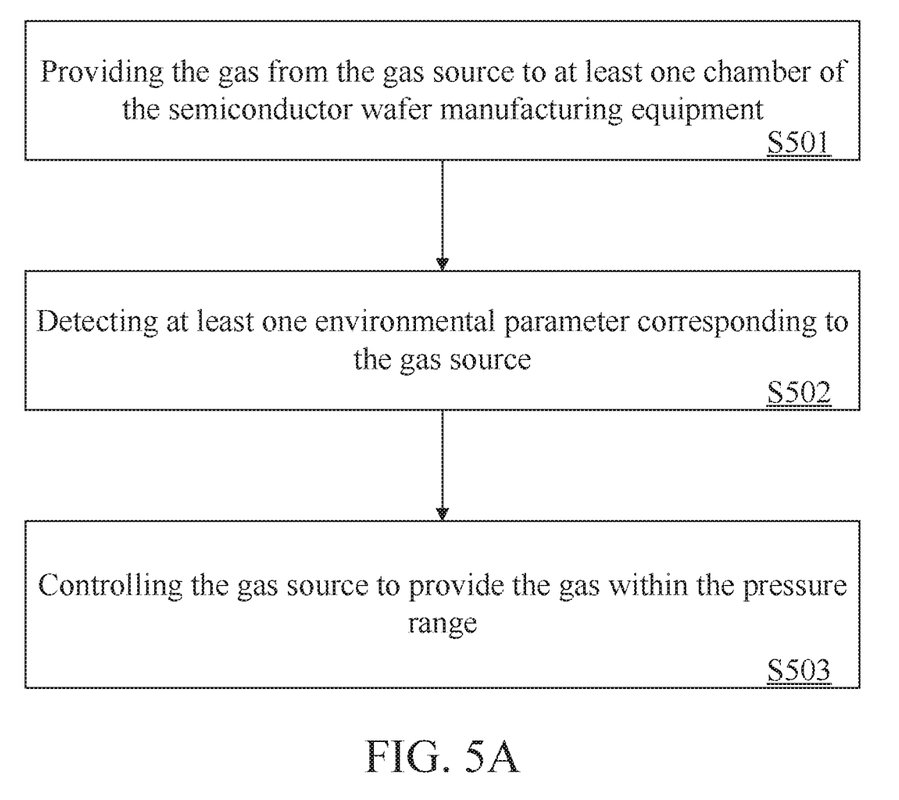
FIGS. 5A and 5B are flowchart diagrams according to some embodiments of the present disclosure.

Some embodiments of the present disclosure include a semiconductor manufacturing method, and a flowchart diagram thereof is as shown in FIG. 5A. The method of some embodiments is implemented by a semiconductor manufacturing equipment, a gas source and a system (e.g., the system 1 or 2 of the aforesaid embodiments). Detailed operations of the method are as follows.

Operation S501 is performed to provide a gas from the gas source to at least one chamber of the semiconductor wafer manufacturing equipment. Operation S502 is performed to detect at least one environmental parameter corresponding to the gas source. Operation S503 is performed to control, according to the at least one environmental parameter, the gas source to provide the gas within a pressure range. In some embodiments, operation S503 is performed to control a regulator of the gas source to provide the gas within the pressure range. The regulator includes an electric valve.

Figure 5B:
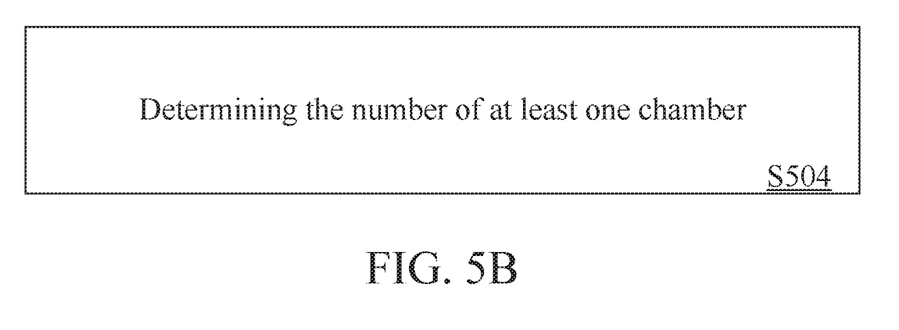

In some embodiments, operation S504 is optionally performed to determine a number of the at least one chamber, and operation S503 is performed to control, according to the at least one environmental parameter and the number of the at least one chamber, the gas source to provide the gas within the pressure range. In some embodiments, the pressure range includes negative pressure range from −0.5 Pa to −2.5 Pa.

Some embodiments of the present disclosure provide a semiconductor manufacturing method. The semiconductor manufacturing method includes the operations of: providing a gas from a container through an outlet to a semiconductor wafer manufacturing equipment, wherein a control valve is connected to the outlet to control a gas flow; retrieving a set of parameters corresponding to the gas flow; and determining a nominal position of the control valve by incorporating the set of parameters through a processor in order to provide a desired flow passage into the semiconductor wafer manufacturing equipment, wherein the semiconductor wafer manufacturing equipment includes a plurality of independent reaction chambers, wherein each reaction chamber is individually supplied with a gas pipe, and each gas pipe receives the gas from the container.

Some embodiments of the present disclosure provide a semiconductor manufacturing method. The semiconductor manufacturing method includes the operations of: providing a gas from a gas source to at least one chamber of a semiconductor wafer manufacturing equipment; detecting at least one environmental parameter corresponding to the gas source; and controlling, according to the at least one environmental parameter, the gas source to provide the gas within a pressure range.

Some embodiments of the present disclosure provide a system for semiconductor manufacturing. The system includes at least one sensor and a processor. The at least one sensor is located with a gas source and configured to sense at least one environmental parameter. The processor is electrically connected to the at least one sensor and configured to: receive the at least one environmental parameter from the at least one sensor; and transmit a signal to a valve of the gas source for controlling an output level of the valve according to the at least one environmental parameter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor manufacturing method, comprising:
providing a gas from a container through an outlet to a semiconductor wafer manufacturing equipment, wherein a control valve is connected to the outlet to control a gas flow;
retrieving a set of parameters corresponding to the gas flow; and
determining a nominal position of the control valve by incorporating the set of parameters through a processor in order to provide a desired flow passage into the semiconductor wafer manufacturing equipment, wherein the semiconductor wafer manufacturing equipment includes a plurality of independent reaction chambers, wherein each reaction chamber is individually supplied with a gas pipe, and each gas pipe receives the gas from the container.

2. The semiconductor manufacturing method of claim 1, further comprising:
performing deposition of a W film on a semiconductor wafer in one of the reaction chambers.

3. The semiconductor manufacturing method of claim 2, wherein the W film is deposited on a wall of a trench in the semiconductor wafer.

4. The semiconductor manufacturing method of claim 3, wherein a semiconductive or conductive material is exposed from the bottom of the trench.

5. The semiconductor manufacturing method of claim 3, wherein the trench has a dielectric sidewall.

6. The semiconductor manufacturing method of claim 3, whereinoe gas includes $WF_6$.

7. The semiconductor manufacturing method of claim 1, wherein the set of parameters comprises: environment temperature inside a cabinet accommodating the container, pressure inside the cabinet, number of the reaction chambers being actively performing deposition of the W film, and flow setting of a recipe for performing deposition of the W film.

8. The semiconductor manufacturing method of claim 1, further comprising:
measuring a gas pressure around the outlet by a pressure gauge.

9. The semiconductor manufacturing method of claim 8, wherein the measured gas pressure is transmitted to the processor and is verified with a specified outlet pressure.

10. The semiconductor manufacturing method of claim 1, wherein each of the pipes is equipped with a mass flow controller.

11. A semiconductor manufacturing method, comprising:
providing a gas from a gas container through an outlet to at least one chamber of a semiconductor wafer manufacturing equipment;
detecting at least one environmental parameter corresponding to a space where the gas container disposed in; and
controlling, according to the at least one environmental parameter corresponding to the space, a regulator of the gas container to provide the gas within a pressure range, wherein the regulator is connected to the outlet.

12. The semiconductor manufacturing method of claim 11, wherein controlling the gas container to provide the gas further comprises:
controlling the regulator of the gas container to provide a desired flow passage of the gas to keep a gas pressure of the gas within the pressure range according to the at least one environmental parameter.

13. The semiconductor manufacturing method of claim 12, wherein the regulator includes an electric valve.

14. The semiconductor manufacturing method of claim 11, further comprising:
determining a number of the at least one chamber;
wherein the gas container is controlled to provide the gas within the pressure range according to the at least one environmental parameter and the number of the at least one chamber.

15. The semiconductor manufacturing method of claim 11, wherein the pressure range includes negative pressure range.

16. The semiconductor manufacturing method of claim 15, wherein the pressure range is between −0.5 Pa to −2.5 Pa.

17. A system for semiconductor manufacturing, comprising:
at least one sensor, being located with a gas container and configured to sense at least one environmental parameter of a space where the gas container disposed in;
a processor, being electrically connected to the at least one sensor and configured to:
receive the at least one environmental parameter of the space from the at least one sensor; and
transmit a signal to a valve of the gas container for controlling an output level of the valve according to the at least one environmental parameter, wherein the valve is connected to an outlet between the gas container and at least one chamber.

18. The system of claim 17, wherein the processor is further configured to:
determine a number of at least one chamber, wherein the gas container provides gas to the at least one chamber;
transmit the signal to the valve of the gas container source for controlling the output level of the valve according to the at least one environmental parameter and the number of the at least one chamber.

19. The system of claim 18, wherein the processor is further configured to:
   receive the number of the at least one chamber from a semiconductor wafer manufacturing equipment including the at least one chamber.

20. The system of claim 17, wherein the at least one sensor includes temperature sensor or humidity sensor.

* * * * *